United States Patent
Morand et al.

(10) Patent No.: US 6,734,483 B2
(45) Date of Patent: May 11, 2004

(54) PROCESS FOR FABRICATING A CAPACITOR WITHIN AN INTEGRATED CIRCUIT, AND CORRESPONDING INTEGRATED CIRCUIT

(75) Inventors: Yves Morand, Grenoble (FR); Jean-Luc Pelloie, Moirans (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/932,513

(22) Filed: Aug. 17, 2001

(65) Prior Publication Data

US 2002/0022333 A1 Feb. 21, 2002

(30) Foreign Application Priority Data

Aug. 18, 2000 (FR) .............................. 00 10727

(51) Int. Cl.⁷ ....................... H01L 27/108; H01L 29/76; H01L 29/94
(52) U.S. Cl. ....................... 257/301; 257/306; 257/324; 257/760; 438/243; 438/244; 438/253; 438/256; 438/386; 438/387
(58) Field of Search .................. 438/243, 244, 438/253–256, 386, 387, 396; 257/301, 306, 324, 760

(56) References Cited

U.S. PATENT DOCUMENTS 5,808,855 A   9/1998  Chan et al.
6,008,083 A * 12/1999 Brabazon et al. ........... 438/239
6,150,206 A   11/2000 Oh
6,452,251 B1 * 9/2002 Berstein et al. ............. 257/532

FOREIGN PATENT DOCUMENTS

EP  0975018 A1  1/2000
EP  1020905 A1  7/2000

OTHER PUBLICATIONS

European Search Report dated Aug. 27, 2001 for European Patent Application No. 01402040.8.
Preliminary Search Report for French Patent Application No. 0010727 dated Apr. 12, 2001.

* cited by examiner

Primary Examiner—Hsien Ming Lee
(74) Attorney, Agent, or Firm—Lisa K. Jorgenson; Jose Gutman; Fleit, Kain, Gibbons, Gutman, Bongini & Bianco P.L.

(57) ABSTRACT

A production of a capacitor includes the simultaneous production, in at least part of an intertrack insulating layer (3) associated with a given metallization level, on the one hand, of the two electrodes (50, 70) and of the dielectric layer (60) of the capacitor and, on the other hand, of a conducting trench (41) which laterally extends the lower electrode of the capacitor, is electrically isolated from the upper electrode and has a transverse dimension smaller than the transverse dimension of the capacitor, and the production, in the interlevel insulating layer (8) covering the intertrack insulating layer, of two conducting pads (80, 81) which come into contact with the upper electrode of the capacitor and with the conducting trench, respectively.

18 Claims, 6 Drawing Sheets

PROCESS FOR FABRICATING A CAPACITOR WITHIN AN INTEGRATED CIRCUIT, AND CORRESPONDING INTEGRATED CIRCUIT

CROSS-REFERENCE TO RELATED APPLICATIONS

This application is based upon and claims priority from prior French Patent Application No. 0010727, filed on Aug. 18, 2000, the entire disclosure of which is herein incorporated by reference.

BACKGROUND OF THE INVENTION

1. Field of the Invention

The present invention generally relates to the fabrication of integrated circuits and more particularly to the production of "metal-metal" capacitors.

2. Description of the Prior Art

Among the various types of capacitor that can appear within an integrated circuit on a semiconductor chip, for example a silicon chip, mention may be made of capacitors known as "polysilicon-silicon", "polysilicon-polysilicon" or "metal-metal" capacitors, depending on the composition of their electrodes.

Capacitors known as "metal-metal" capacitors, that is to say those in which the two electrodes are made of metal, allow capacitors of high capacitance to be produced and offer the advantage of having a very small variation in the capacitance depending on the voltage that is applied to them. Furthermore, they have a very small resistive component. Thus, "metal-metal" capacitors are advantageously used in radio-frequency applications.

An integrated circuit generally comprises electronic components, for example transistors, produced within a semiconductor substrate, and various metallization levels making it possible in particular to produce interconnect tracks between the various components of the integrated circuit. Each metallization level then generally has, after a metal layer has been etched, several interconnect tracks located at this same level that are mutually separated by an intertrack insulating layer. The metallization level immediately above is then produced on an interlevel insulating layer covering the lower metallization level. Interconnection between tracks located at two adjacent metallization levels is achieved by interconnect holes filled with a fill metal, for example tungsten, and usually called by those skilled in the art "vias".

A known process for fabricating a metal-metal capacitor within an integrated circuit consists in producing one of the electrodes of the capacitor at the same time as all of the interconnect tracks of a given metallization level. On this given metallization level is then deposited an interlevel insulating layer intended to support the metallization level immediately above it. An aperture emerging above the first electrode of the capacitor is then etched in this interlevel insulating layer and then a thin layer of dielectric, for example generally silicon dioxide or possibly silicon nitride, is then deposited. The aperture is then filled, by deposition followed by planarization, with fill metal, typically tungsten. Next, the metal layer of the metallization level immediately above is deposited and etched so as to produce the interconnect tracks of this metallization level, and the second electrode of the metal-metal capacitor.

In other words, according to this solution, the two electrodes of the metal-metal capacitor are produced on two metallization levels.

In other solutions, provisions are made to produce the two electrodes of the metal-metal capacitor using a single conducting level.

Thus, in French Patent Application No. 2 766 294, the two metal electrodes and the dielectric layer of the capacitor are produced virtually on one metallization level, the lower electrode of the capacitor resulting from etching of the metal layer intended to form the various tracks of the metallization level.

U.S. Pat. No. 6,008,083 describes another way of producing a metal-metal capacitor whose two electrodes are produced within the same interlevel insulating layer. However, the production of such a capacitor requires, prior to the production of the lower electrode, the formation of a pad contacting this lower electrode and produced within the lower metallization level.

Accordingly, there exists a need for overcoming the disadvantages of the prior art as discussed above.

SUMMARY OF THE INVENTION

The aim of the invention is to produce a metal-metal capacitor using a single conducting level, but according to a process which is completely different from those used in the prior art and especially requiring no formation, prior to that of the first electrode, of a contact pad allowing connection to the lower electrode.

According to an aspect of the invention a preferred embodiment provides production processes that are compatible with a process of the "damascene" type using the term well known to those of ordinary skill in the art.

According to an aspect of the invention a preferred embodiment provides a process that allows the production, at the same level, of a capacitor and of a metal track belonging to this metallization level.

A subject of the invention is therefore a process for fabricating an integrated circuit, comprising the production of several metallization levels, which are mutually separated by interlevel insulating layers, and of intertrack insulating layers each separating the tracks of the same metallization level. The process also comprises the production of at least one capacitor comprising a lower electrode and an upper electrode which are mutually separated by a dielectric layer.

According to a preferred embodiment of the invention, the production of the capacitor comprises:

the simultaneous production, in at least part of an intertrack insulating layer associated with a given metallization level, on the one hand, of the two electrodes and of the dielectric layer of the capacitor and, on the other hand, of a conducting trench which laterally extends the lower electrode of the capacitor, is electrically isolated from the upper electrode and has a transverse dimension smaller than the transverse dimension of the capacitor; and the production, in the interlevel insulating layer covering the intertrack insulating layer, of two conducting pads which come into contact with the upper electrode of the capacitor and with the conducting trench, respectively.

In other words, the invention, by simultaneously producing the capacitor and the lateral trench, provides for the contacting of the two electrodes of the capacitor from the top of the integrated circuit. The invention therefore in no way requires the formation, prior to that of the capacitor, of a lower contact pad for connection to the lower electrode.

According to one method of implementing the process according to the invention, the production of the capacitor and of the trench comprises:

a) the formation of the intertrack insulating layer on an interlevel insulating layer;

b) the etching of at least part of the intertrack insulating layer so as to form a cavity having a main part laterally extended by the trench;

c) the formation of a first layer of a first conducting material, for example copper or aluminium, on the structure obtained in step b) and the formation of a layer of a dielectric, for example silicon dioxide, on the first layer; and d) the formation of a second layer of a second conducting material, for example also copper or aluminium, on the dielectric layer so as to fill the main part of the cavity, the dimensions of the trench and the thicknesses of the first layer and of the dielectric layer being chosen so as to obtain, after step d), a trench comprising at least the first conducting material but not containing the second conducting material (the trench possibly containing dielectric material);

e) chemical-mechanical polishing of the multilayer stack formed in steps c) and d) so as to leave, in the main part of the cavity, the capacitor whose lower electrode is formed from a residual part of the first layer coating the internal walls of the cavity and whose upper electrode is formed from a residual part of the second layer, which is separated from the residual part of the first layer by a residual part of the dielectric layer, and to leave, in the trench, another residual part of the first layer coating at least the internal walls of the trench, to the exclusion of any residual part of the second layer.

The first conducting layer and the dielectric layer are formed in step c) by a conformal coating. In this case, the width of the trench is preferably at least twice the thickness of the first conducting layer and less than twice the sum of the thickness of the first conducting layer and of the thickness of the dielectric layer.

Depending on the dimensions of the trench, the latter may comprise only the conducting material forming the first electrode, or possibly the conducting material forming the first layer and a residual part of the dielectric material.

The invention also makes it possible, advantageously, to produce the tracks of the given metallization level simultaneously with the formation of the upper electrode of the capacitor.

Thus, according to one method of implementing a preferred embodiment of the invention, the production of the tracks of the given metallization level comprises:

after step c), etching of the dielectric layer, of the first conducting layer and of the intertrack insulating layer so as to form at least one auxiliary trench (defining the location of a track);

the deposition of the second conducting layer carried out in step d) so as to fill the trench or trenches; and the chemical-mechanical polishing carried out in step e) so as to remove the first conducting layer, the dielectric layer and the second conducting layer from the surface of the intertrack insulating layer.

The subject of the invention is also an integrated circuit comprising several metallization levels, which are mutually separated by interlevel insulating layers, and intertrack insulating layers each separating the tracks of the same metallization level. The integrated circuit also includes at least one capacitor comprising a lower electrode and an upper electrode that are mutually separated by a dielectric layer.

According to a general aspect of the invention, the capacitor is located in at least part of an intertrack insulating layer associated with a given metallization level. The lower electrode of the capacitor is laterally extended by a conducting trench that is electrically isolated from the upper electrode and has a transverse dimension smaller than the transverse dimension of the capacitor. The integrated circuit also comprises, in the interlevel insulating layer covering the intertrack insulating layer, two conducting pads which come into contact with the upper electrode of the capacitor and with the conducting trench, respectively.

According to one embodiment of the integrated circuit according to the invention, the trench comprises only the conducting material forming the lower electrode.

In another embodiment of the invention, the trench may only comprise the dielectric encapsulated by the conducting material forming the lower electrode.

However, in all cases, the trench contains no conducting material forming the second electrode.

Moreover, the tracks of the given metallization level are advantageously formed from the same material as that forming the upper electrode of the capacitor.

BRIEF DESCRIPTION OF THE DRAWINGS

Further advantages and characteristics of the invention will become apparent on examining the detailed description of entirely non-limiting embodiments and methods of implementation, and the appended drawings in which.

DESCRIPTION OF THE PREFERRED EMBODIMENTS

Figure 1:
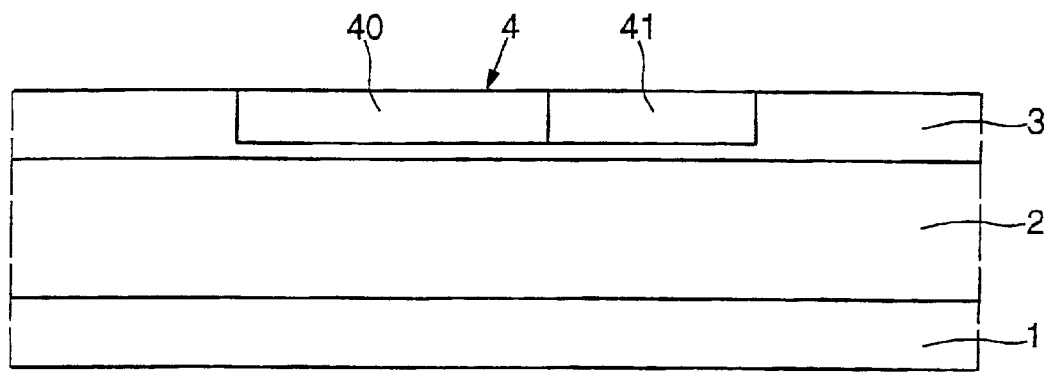
FIGS. 1, 2, 3a to 3c, 4a to 4c and 5 illustrate a first method of implementing a process according to the invention, resulting in a first embodiment of a capacitor according to the invention.
Figure 2:
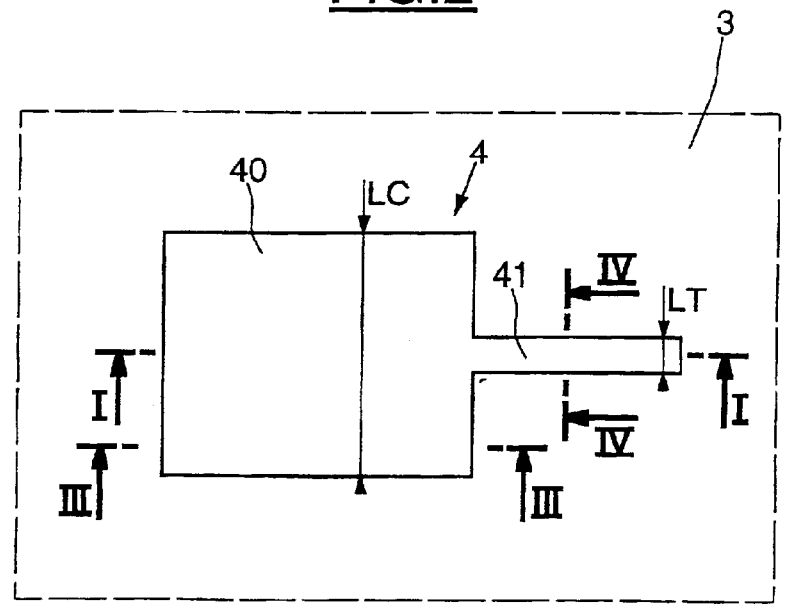

In FIG. 1, which is a view on the line I—I of FIG. 2, the reference 1 denotes, for example, a first metallization level comprising metal tracks mutually insulated by an intertrack dielectric layer. In an alternative version, the reference 1 could represent a semiconductor substrate comprising, for example, transistors.

Throughout the following text, it will be assumed that the reference 1 denotes, for example, the metallization level M1.

This level M1, typically having a thickness of less than 0.5 microns, is covered with an interlevel insulating layer 2 typically having a thickness of between 0.5 microns and 1 micron.

Next, deposited on the interlevel dielectric layer 2 is a dielectric layer 3 intended to form the intertrack dielectric of the metal tracks of the metallization level immediately above, namely the metallization level M2.

Part of the intertrack insulating layer 3 is then etched so as to form a cavity 4, illustrated in a top view in FIG. 2, and comprising a main part 40 laterally extended by a trench 41.

In FIG. 3, the depth of the cavity 4 is less than the thickness of the layer 3. However, this thickness could be equal to or even greater than the thickness of the layer 3, the cavity then extending partially into the subjacent insulating layer 2.

Of course, a person skilled in the art will know how to adjust the etching parameters so that the depth of the cavity 4 is not too great, especially so as to prevent it from emerging at the lower metallization level M1.

The transverse dimension LT or width of the trench 41 here is smaller than the transverse dimension LC of the main part 40 of the cavity 4. It will be explained in greater detail below how the value of the lateral dimension LT of the trench is chosen.

Figure 3A:
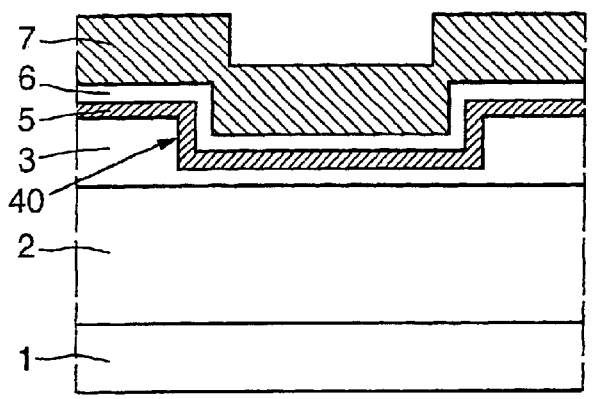
Figure 4A:
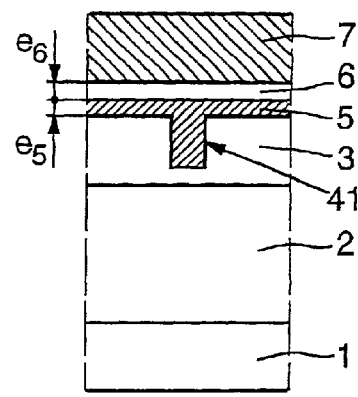
Figure 3B:
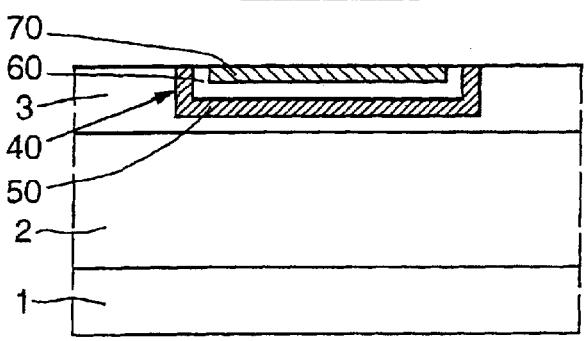
Figure 4B:
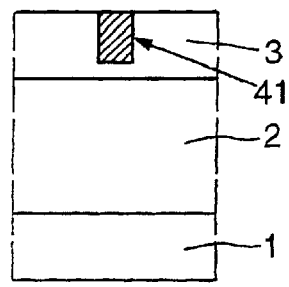
Figure 3C:
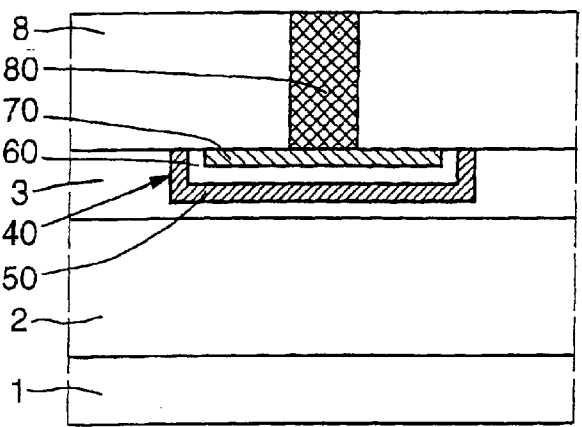
Figure 4C:
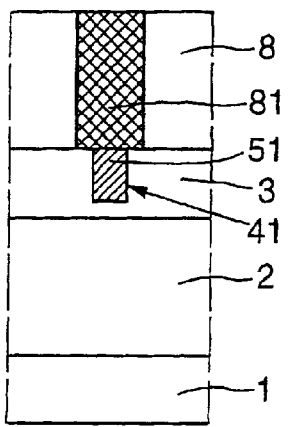

In the rest of the description, FIGS. 3a to 3c illustrate the structures seen on the line III—III FIG. 2, while FIGS. 4a to 4c illustrate the same structures seen on the line IV—IV of FIG. 2.

Deposited on the structure illustrated in FIGS. 1 and 2 is a first layer 5 of a first conducting material (FIGS. 3a and 4a). This first conducting material, which will be intended to form the material of the first electrode of the capacitor, is a metal such as, for example, aluminum, titanium, titanium nitride, tantalum nitride, etc.

The thickness $e_5$ of this first layer 5 is typically about 0.1 microns and the first layer is formed, for example, by a conformal coating deposited by chemical vapor deposition (CVD).

A layer 6 of a dielectric is then formed, also for example by CVD, on the first layer 5. This dielectric layer may be formed, for example, from silicon dioxide, silicon nitride or any material having a high dielectric constant. The thickness $e_6$ of this layer 6 is, for example, about 0.1 microns.

Next, the dielectric layer 6 is covered with a second layer 7 formed from a second conducting material, which may be similar to or completely different from the first conducting material forming the layer 5.

The thickness of this layer 7, which is also formed for example by CVD, is chosen so as to fill the main part 40 of the cavity.

In general, the dimensions of the trench, and especially the lateral dimension LT, and the thicknesses of the first layer 5 and of the dielectric layer 6 are chosen so as to obtain, after the layers 5, 6 and 7 have been deposited, a trench comprising the first conducting material 5 and possibly the dielectric, but in no case containing the second conducting material 7.

Thus, when the layers are obtained by conformal coating, the width LT of the trench will be chosen to be less than twice the sum $e_5+e_6$ of the thickness of the first layer 5 and of the thickness of the dielectric layer 6.

In the example illustrated in FIG. 4a, it is assumed that the width LT is such that the trench 41 is only filled with the first conducting material 5.

Next, (FIGS. 3b and 4b), the structure illustrated in FIGS. 3a and 4a undergoes chemical-mechanical polishing so as to remove the second conducting layer, the dielectric layer and the first conducting layer from the surface of the intertrack insulating layer 3.

Thus, at this stage the main part of the cavity 40 is coated with a residual part 50 of the layer 5, covered with a residual part 60 of the dielectric layer which is itself covered with a residual part 70 of the second conducting layer 7. Likewise, the lateral trench 41 is filled with another residual part 51 of the first conducting layer 5.

The residual part 50 will thus form the lower electrode of the capacitor while the residual part 70 will form the upper electrode, the two electrodes being separated by a dielectric 60.

Next, the intertrack insulating layer 8 intended to mutually insulate the tracks of the metallization level M2 is deposited in a conventional manner known per se (FIGS. 3c and 4c).

This intertrack insulating layer 8 is then locally etched so as to form two cavities emerging above the upper electrode 70 of the capacitor and above the conducting lateral trench 41, respectively.

These two cavities are filled with a metallic material, which will result, after chemical-mechanical polishing, in the formation of two conducting pads 80 and 81 (FIG. 5) which come into contact with the upper electrode 70 of the capacitor and with the conducting trench 41, respectively.

Figure 5:
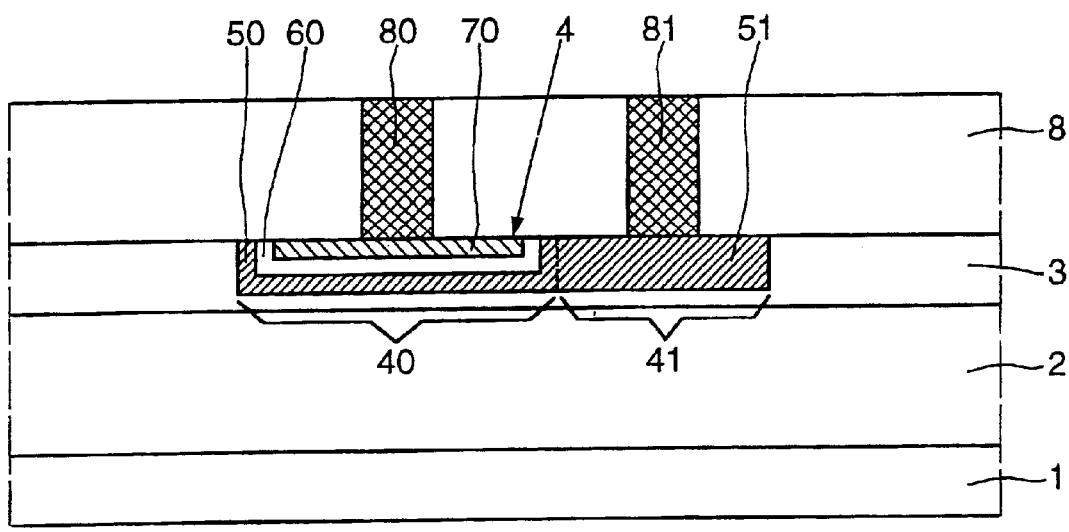

This FIG. 5 therefore shows that the two contact terminals of the capacitor are made from the top, the conducting pad 81 being in contact with the lower electrode of the capacitor via the conducting trench 41 filled with the conducting material 51.

Figure 6:
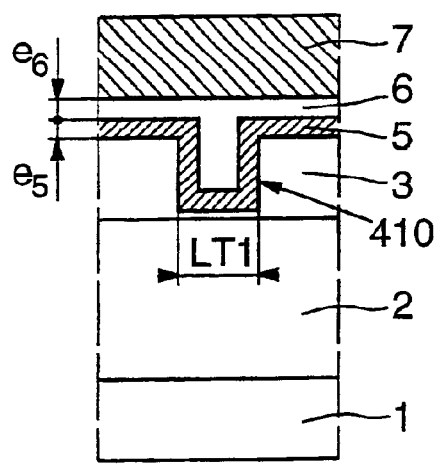
FIGS. 6 and 7 partially illustrate a second method of implementing a process according to the invention, resulting in a lateral trench also comprising a dielectric.
Figure 7:
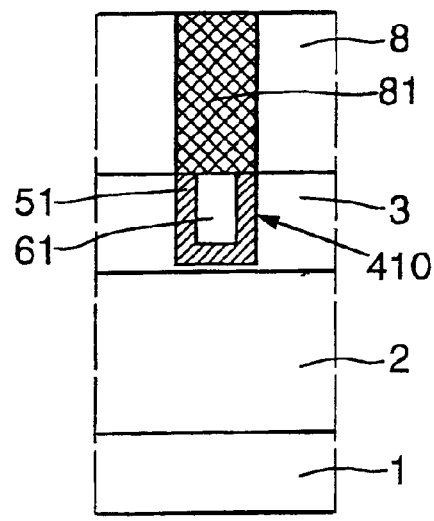

In the alternative method of implementation and embodiment illustrated in FIGS. 6 and 7, the width LT1 of the lateral trench 410 was chosen, for example, to be slightly less than twice the sum $e_5+e_6$, which results in this trench 410 being filled with the conducting material 5 but also with the dielectric 6. This finally results, as illustrated in FIG. 7, in a trench 410 comprising only the dielectric 61 encapsulated by the conducting material 51 forming the lower electrode of the capacitor.

Reference is now made to FIGS. 8 to 11 in order to describe an example of a method of implementing the process according to the invention allowing the almost simultaneous production of a metal track of the metallization level M2 and of the upper electrode of the capacitor.

Figure 8:
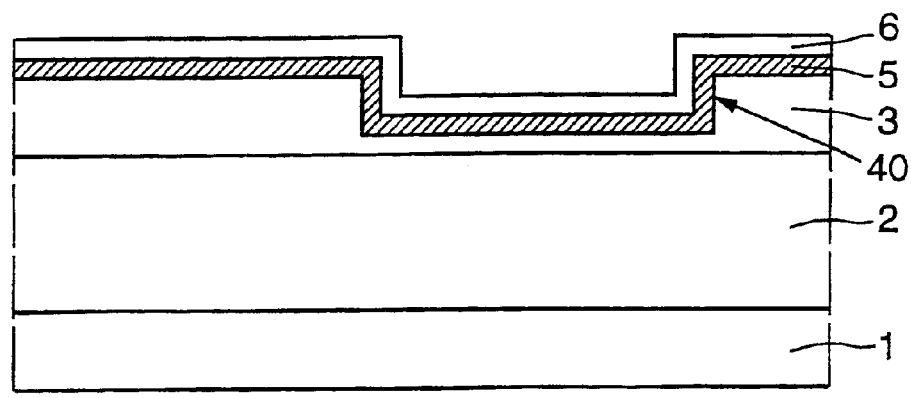
FIGS. 8 to 11 illustrate an alternative version of the process according to the invention, allowing the second electrode of a capacitor and a track of the corresponding metallization level to be simultaneously produced.
Figure 9:
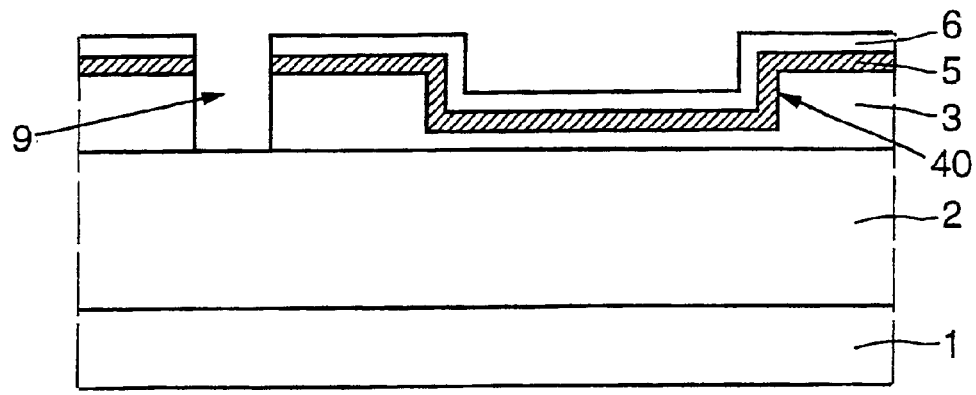

In this respect, as illustrated in FIG. 8, after the multilayer stack comprising the layer 5 and the dielectric layer 6 has been deposited on the insulating layer 3 and in the cavity 4 made in this layer 3, this assembly is then etched so as to form at least one auxiliary trench 9 (FIG. 9) in which the future metal track of the metallization level M2 will be produced.

Figure 10:
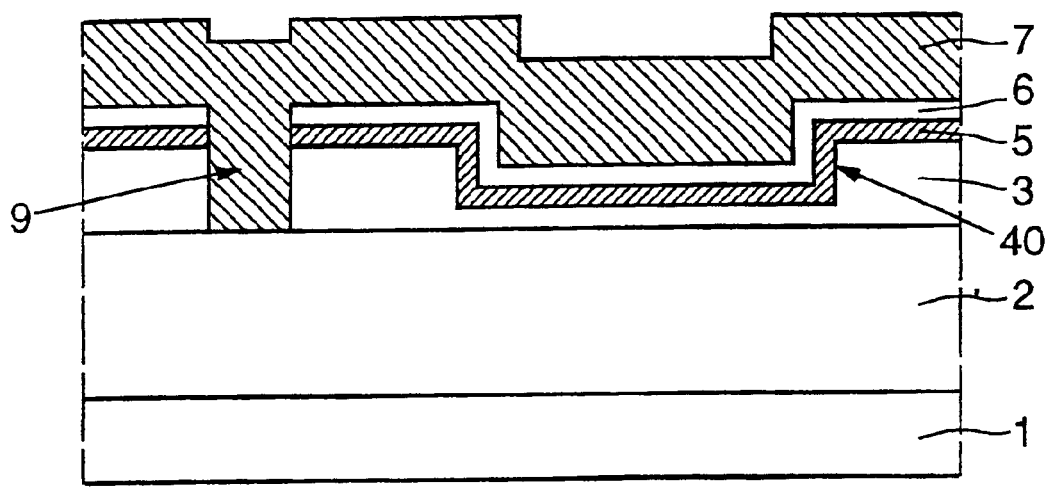

Next, as illustrated in FIG. 10, the second conducting layer 7, simultaneously filling the main part 40 of the cavity and the auxiliary trench 9, is deposited.

Figure 11:
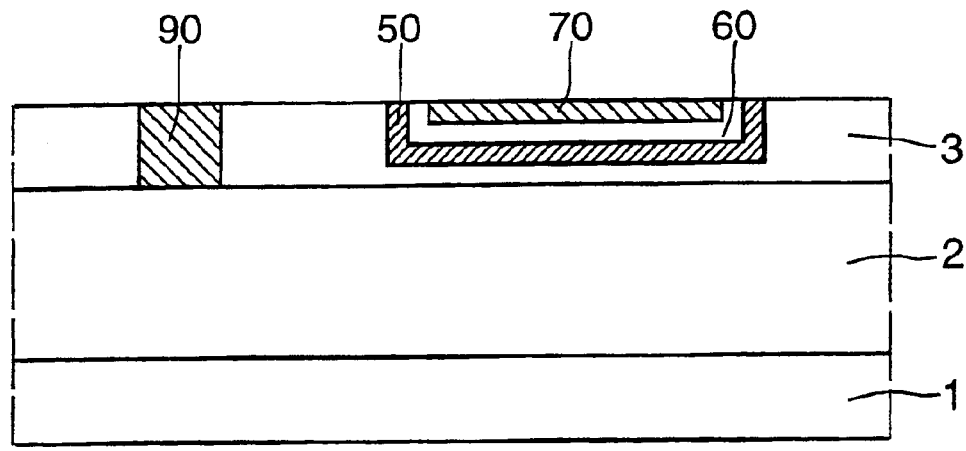

After chemical-mechanical polishing of the structure illustrated in FIG. 10 and removal of the first conducting layer 5, the dielectric layer 6 and the second conducting layer 7 from the surface of the intertrack insulating layer 3, the structure illustrated in FIG. 11 is obtained in which the reference 90 denotes the track of the metallization level M2 thus formed simultaneously with the formation of the upper electrode 70 of the capacitor.

The rest of the process is carried out as described above, with possibly the production of a via above the track 90 for possible connection to a track of an upper metallization level M3.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A process for fabricating an integrated circuit, comprising:

producing a plurality of metallization levels, two of which are mutually separated by an interlevel insulating layer:

producing intertrack insulating layers each separating tracks of a metallization level; and producing at least one capacitor comprising a lower electrode and an upper electrode which are mutually separated by a dielectric layer, wherein the production of the at least one capacitor comprises:

simultaneously producing, in at least part of an intertrack insulating layer associated with one of the a plurality of metallization levels, on the one hand, the lower electrode, the upper electrode, and the dielectric layer of the at least one capacitor and, on the other hand, simultaneously producing a conducting trench which laterally extends the lower electrode of the at least one capacitor, and is electrically isolated from the upper electrode and has a transverse dimension smaller than the transverse dimension of the at least one capacitor; and producing, in the interlevel insulating layer covering the intertrack insulating layer, two conducting pads which come into contact with the upper electrode of the at least one capacitor and with the conducting trench, respectively.

2. The process according to claim 1, wherein the conducting trench comprises a conducting material forming the lower electrode.

3. The process according to claim 1, wherein the tracks of one of the a plurality of metalization levels are produced simultaneously with the formation of the upper electrode of the at least one capacitor.

4. The process according to claim 1, wherein the producing of the the at least one capacitor and of the conducting trench comprises:

a) forming one of the intertrack insulating layers on the interlevel insulating layer;

b) etching at least part of the one of the intertrack insulating layers to form a cavity having a main part laterally extended by the conducting trench;

c) forming a first conducting layer of a first conducting material in the cavity and the conducting trench obtained in step b) and forming a dielectric layer of a dielectric material on the first conducting layer;

d) forming a second conducting layer of a second conducting material on the dielectric layer to fill the main part of the cavity, wherein the dimensions of the conducting trench and the thickness of the first conducting layer and of the dielectric layer being chosen to obtain, after step d), the conducting trench comprising at least the first conducting material but not containing the second conducting material; and e) chemical-mechanical polishing the first conducting layer, the dielectric layer, and the second conducting layer, to form the at least one capacitor in the main part of the cavity, wherein the lower electrode is formed from a residual part of the first conducting layer resided in internal walls of the cavity an the upper electrode is formed from a residual part of the second conducting layer, which is separated from the residual part of the first conducting layer by a residual part of the dielectric layer; and to leave another residual part of the first conducting layer in the conducting trench.

5. The process according to claim 4, wherein the conducting trench comprises a material of the first conducting layer forming the lower electrode.

6. The process according to claim 4, wherein the tracks of a one of the a plurality of metallization levels are produced simultaneously with the producing of the upper electrode of the at least one capacitor.

7. The process according to claim 4, wherein the producing of the tracks of one of the a plurality of metallization levels comprises:

after step c), etching the dielectric layer of the first conducting layer and of the intertrack insulating layer to form at least one auxiliary trench;

the formation of the second conducting layer being carried out in step d) to substantially fill the conducting trench; and chemical-mechanical polishing to remove the first conducting layer, the dielectric layer and the second conducting layer from the surface of the intertrack insulating layer.

8. The process according to claim 4, wherein the first conducting layer and the dielectric layer are formed in step c) by a conformal coating and in that the width of the conducting trench is at least twice the thickness of the first conducting layer and less than twice the sum of the thickness of the first conducting layer and of the thickness of the dielectric layer.

9. The process according to claim 8, wherein the conducting trench comprises a material of the first conducting layer forming the lower electrode.

10. The process according to claim 8, wherein the tracks of a one of the a plurality of metallization levels are produced simultaneously with the producing of the upper electrode of the at least one capacitor.

11. The process according to claim 10, wherein the producing of the tracks of one of the a plurality of metallization levels comprises:

after step c), etching of the dielectric layer, of the first conducting layer and of the intertrack insulating layer to form at least one auxiliary trench;

the formation of the second conducting layer being carried out in step d) to substantially fill the conducting trench; and chemical-mechanical polishing to remove the first conducting layer, the dielectric layer and the second conducting layer from the surface of the intertrack insulating layer.

12. An integrated circuit comprising:

a plurality of metallization levels, which are mutually separated by interlevel insulating layers;

intertrack insulating layers each separating tracks of a metallization level;

at least one capacitor comprising a lower electrode and an upper electrode which are mutually separated by a dielectric layer, wherein the at least one capacitor is located in at least part of an intertrack insulating layer associated with one of the a plurality of metallization levels, the lower electrode of the at least one capacitor is laterally extended by a conducting trench, which is electrically isolated from the upper electrode and has a transverse dimension smaller than the transverse dimension of the at least one capacitor, and one of the interlevel insulating layers covering the intertrack insulating layer; and two conducting pads which come into contact with the upper electrode of the at least one capacitor and with the conducting trench, respectively.

13. The integrated circuit according to claim 12, wherein the tracks of one of the a plurality of metallization levels are formed from the material as that forming the upper electrode of the at least one capacitor.

14. The integrated circuit according to claim 12, wherein the conducting trench comprises a conducting material forming the lower electrode.

15. The integrated circuit according to claim 14, wherein the tracks of one of the a plurality of metallization levels are formed from the material as that forming the upper electrode of the at least one capacitor.

16. The integrated circuit according to claim 12, wherein the conducting trench comprises dielectric encapsulated by a conducting material forming the lower electrode.

17. The integrated circuit according to claim 16, wherein the tracks of one of the a plurality of metallization levels are formed from the material as that forming the upper electrode of the at least one capacitor.

18. An integrated circuit comprising:
- a plurality of metallization levels that are mutually separated by interlevel insulating layers;
- a plurality of intertrack insulating layers, each of the plurality of intertrack insulating layers separating tracks of a metallization level; and
- at least one capacitor comprising a lower electrode and an upper electrode, which are mutually separated by a dielectric layer, and wherein the at least one capacitor is located in at least part of an intertrack insulating layer associated with one of the plurality of metallization levels, and the lower electrode of the at least one capacitor is laterally extended by a conducting trench, which is electrically isolated from the upper electrode and has a transverse dimension smaller than the transverse dimension of the at least one capacitor, and the interlevel insulating layer covering the intertrack insulating layer; and
- two conducting pads being in contact with the upper electrode of the at least one capacitor and with the conducting trench, respectively, and wherein the tracks of one of the plurality of metallization levels are formed from the same material as that of the upper electrode of the at least one capacitor.

* * * * *

UNITED STATES PATENT AND TRADEMARK OFFICE
CERTIFICATE OF CORRECTION

PATENT NO.     : 6,734,483 B2
DATED          : May 11, 2004
INVENTOR(S)    : Yves Morand et al.

It is certified that error appears in the above-identified patent and that said Letters Patent is hereby corrected as shown below:

<u>Title page,</u>
Item [73], Assignee, please add -- Commissariat A L'Energie Atomique --

Signed and Sealed this

Twenty-first Day of December, 2004

JON W. DUDAS
*Director of the United States Patent and Trademark Office*